(12) United States Patent
Zang et al.

(10) Patent No.: US 12,169,122 B2
(45) Date of Patent: Dec. 17, 2024

(54) SCREEN DISPLAY CONTROL METHOD AND ELECTRONIC DEVICE

(71) Applicant: VIVO MOBILE COMMUNICATION CO., LTD., Guangdong (CN)

(72) Inventors: Yakui Zang, Guangdong (CN); Weibin Chen, Guangdong (CN); Xiaoqing Zhang, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 330 days.

(21) Appl. No.: 17/742,223

(22) Filed: May 11, 2022

(65) Prior Publication Data

US 2022/0268567 A1 Aug. 25, 2022

Related U.S. Application Data

(63) Continuation of application No. PCT/CN2020/129627, filed on Nov. 18, 2020.

(30) Foreign Application Priority Data

Nov. 22, 2019 (CN) .......................... 201911158663.5

(51) Int. Cl.
*G06F 3/041* (2006.01)
*G01B 11/00* (2006.01)
(Continued)

(52) U.S. Cl.
CPC .......... *G01B 11/026* (2013.01); *G01B 11/022* (2013.01); *H04M 1/0264* (2013.01);
(Continued)

(58) Field of Classification Search
CPC ... G01B 11/022; G01B 11/026; G06F 1/1637; G06F 1/1686; H04M 1/0264;
(Continued)

(56) References Cited

U.S. PATENT DOCUMENTS

2009/0009628 A1 1/2009 Janicek
2013/0135328 A1 5/2013 Rappoport et al.
(Continued)

FOREIGN PATENT DOCUMENTS

CN 106257909 A 12/2016
CN 106878564 A 6/2017
(Continued)

OTHER PUBLICATIONS

First Office Action for Chinese Application No. 201911158663.5, dated Oct. 12, 2020, 7 Pages.
(Continued)

*Primary Examiner* — Insa Sadio
(74) *Attorney, Agent, or Firm* — BROOKS KUSHMAN P.C.

(57) ABSTRACT

A screen display control method and an electronic device are provided. The method is performed by an electronic device with a camera installed under a screen. The method includes: receiving a first input of a user; controlling, in response to the first input, the camera to be in an operating state, and controlling a target region of the screen to be in an off state, where the target region is a region determined according to a field of view of the camera and position information of the camera.

15 Claims, 5 Drawing Sheets

(51) Int. Cl.
*G01B 11/02* (2006.01)
*H04M 1/02* (2006.01)
*H10K 59/122* (2023.01)
*H10K 59/65* (2023.01)

(52) U.S. Cl.
CPC ........ *H04M 1/0266* (2013.01); *H10K 59/122* (2023.02); *H10K 59/65* (2023.02)

(58) Field of Classification Search
CPC ............ H04M 1/0266; H04M 2250/52; H10K 59/122; H10K 59/65
See application file for complete search history.

(56) References Cited

U.S. PATENT DOCUMENTS

| | | | |
|---|---|---|---|
| 2014/0362257 A1* | 12/2014 | Viljamaa | G06F 1/1684 348/231.99 |
| 2016/0286133 A1 | 9/2016 | Chen et al. | |
| 2016/0373650 A1 | 12/2016 | Kim et al. | |
| 2017/0084231 A1 | 3/2017 | Chew | |
| 2017/0124942 A1 | 5/2017 | Evans, V et al. | |
| 2017/0318226 A1 | 11/2017 | Jung et al. | |
| 2018/0260079 A1 | 9/2018 | Zhang | |
| 2019/0301935 A1* | 10/2019 | Borremans | G01J 3/26 |
| 2021/0389873 A1 | 12/2021 | Chen et al. | |

FOREIGN PATENT DOCUMENTS

| | | | |
|---|---|---|---|
| CN | 106921767 A | 7/2017 |
| CN | 107580092 A | 1/2018 |
| CN | 108366186 A | 8/2018 |
| CN | 109348123 A | 2/2019 |
| CN | 109521937 A | 3/2019 |
| CN | 109917956 A | 6/2019 |
| CN | 110445914 A | 11/2019 |
| CN | 111049973 A | 4/2020 |
| EP | 3267297 A1 | 1/2018 |
| JP | 2009065498 A | 3/2009 |
| JP | 2015099473 A | 5/2015 |
| JP | 2019503500 A | 2/2019 |
| KR | 20170123125 A | 11/2017 |

OTHER PUBLICATIONS

International Search Report and Written Opinion for Application No. PCT/CN2020/129627, dated Feb. 18, 2021, 8 Pages.
First Office Action for Indian Application No. 202227028841, dated Sep. 20, 2022, 5 Pages (including English Translation).
Extended European Search Report Application No. 20889429.5-1224, dated Dec. 7, 2022.
1st Chinese Office Action, English Translation.
1st Indian Office Action, English Translation.
International Search Report and Written Opinion, English Translation.
CN106257909A, English Abstract and U.S. Equivalent U.S. Pub. No. 2016/0373650.
CN106878564A, English Abstract and U.S. Equivalent U.S. Pub. No. 2018/0260079.
CN106921767A, English Abstract and Machine Translation.
CN107580092A, English Abstract and Machine Translation.
CN108366186A, English Abstract and Machine Translation.
CN109348123A, English Abstract and Machine Translation.
CN109521937A, English Abstract and Machine Translation.
CN109917956A, English Abstract and U.S. Equivalent U.S. Pub. No. 2021/0389873.
CN110445914A, English Abstract and Machine Translation.
CN111049973A, English Abstract and Machine Translation.
KR20170123125A, English Abstract and U.S. Equivalent U.S. Pub. No. 2017/0318226.
First Office Action for Japanese Application No. 2022-526355, dated Jun. 30, 2023, 4 Pages.

* cited by examiner

SCREEN DISPLAY CONTROL METHOD AND ELECTRONIC DEVICE

CROSS-REFERENCE TO RELATED APPLICATIONS

This application is a continuation of PCT International Application No. PCT/CN2020/129627 filed on Nov. 18, 2020, which claims priority to Chinese Patent Application No. 201911158663.5, filed on Nov. 22, 2019, which are incorporated herein by reference in their entireties.

TECHNICAL FIELD

Embodiments of the present application relate to the field of communication technologies, and in particular, to a screen display control method and an electronic device.

BACKGROUND

With the development of communication technologies, electronic devices installed with cameras are applied more widely, and changing the installation positions of the cameras can increase the screen-to-body ratios of the electronic devices.

Generally, the camera can be installed under the screen of the electronic device, to increase the screen-to-body ratio of the electronic device as much as possible. For example, the camera may be installed directly under the screen of the electronic device, and the camera captures the light passing through the screen of the electronic device for imaging. However, in the process of capturing images by the camera, if the screen of the electronic device is a self-luminous screen and the screen is in an on state, the light generated by the lighting of the screen may interfere with the imaging of the camera, resulting in poor effect of an image captured by the camera.

SUMMARY

According to a first aspect, an embodiment of the present application provides a screen display control method performed by an electronic device with a camera installed under a screen. The method may include: receiving a first input of a user; and controlling, in response to the first input, the camera to be in an operating state, and controlling a target region of the screen to be in an off state, where the target region is a region determined according to a field of view of the camera and position information of the camera.

According to a second aspect, an embodiment of the present application provides an electronic device, installed with a camera under a screen of the electronic device, and the electronic device may include: a receiving module and a processing module. The receiving module is configured to receive a first input of a user; and the processing module is configured to control, in response to the first input received by the receiving module, the camera to be in an operating state, and control a target region of the screen to be in an off state, where the target region is a region determined according to a field of view of the camera and position information of the camera.

According to a third aspect, an embodiment of the present application provides an electronic device, including a processor, a memory, and a computer program stored in the memory and capable of being run on the processor, the computer program, when executed by the processor, implementing steps of the screen display control method according to the first aspect.

According to a fourth aspect, an embodiment of the present application provides a computer-readable medium, storing a computer program, the computer program, when executed by a processor, implementing steps of the screen display control method according to the first aspect.

DETAILED DESCRIPTION

The following clearly describes the technical solutions in the embodiments of the present application with reference to the accompanying drawings in the embodiments of the present application. Apparently, the described embodiments are some rather than all of the embodiments of the present application. All other embodiments obtained by a person skilled in the art based on the embodiments of the present application without creative efforts shall fall within the protection scope of the present application.

The term "and/or" in this specification is an association relationship for describing associated objects, and represents that three relationships may exist, for example, A and/or B may represent the following three cases: A exists separately, both A and B exist, and B exists separately. The symbol "/" in this specification indicates an "or" relationship between the associated objects, for example, AB indicates A or B.

In the specification and claims of the present application, the terms "first", "second", and the like are intended to distinguish between different objects but do not indicate a particular order of the objects. For example, a first distance and a second distance are used for distinguishing different distances, but not for describing a particular order of distances.

In the embodiments of the present application, the words such as "exemplary" or "for example" are used as an example, illustration, or explanation. Any embodiments or designs described in the embodiments of the present application as "exemplary" or "for example" should not be construed as preferred or advantageous over other embodiments or designs. To be specific, the use of words such as "exemplary" or "for example" is intended to present the related concepts in a specific manner.

In the description of the embodiments of the present application, unless otherwise stated, "a plurality of" means two or more, for example, a plurality of components means two or more components.

The following explains terms/nouns involved in the embodiments of the present application.

Figure 4:
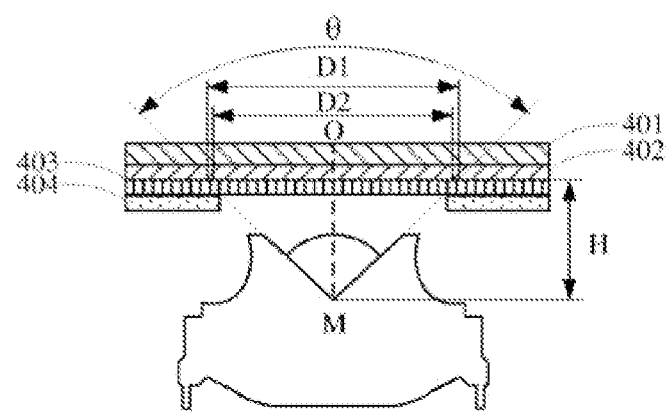
FIG. 4 is a cross-sectional view of a camera of an electronic device according to an embodiment of the present application.

Display screen: A display screen of an electronic device. As shown in FIG. 4, a display screen of an electronic device is divided into a glass cover plate layer 401, a touch sensing layer 402, a liquid crystal display layer 403, and a backlight layer 404 in order from top to bottom. The glass cover plate layer 401 is generally made of a transparent special glass (for example, sapphire glass) material, which can resist external force impact and is directly in contact with fingers. The touch sensing layer 402 may be divided into two types: a resistive screen and a capacitive screen. The main function of this layer is to sense a touch operation of a user. The liquid crystal display layer 403 mainly includes liquid crystal display (LCD), advance super view (ASV), in-plane switching (IPS), and the like. The backlight layer 404 enables an image of the liquid crystal display layer to be displayed. It should be noted that, in the embodiments of the present application, the liquid crystal display layer can display an image with the help of the backlight layer. In addition, to ensure that an under-screen camera can capture a captured image, a part of a region directly above the camera is not provided with a backlight layer. Alternatively, according to embodiments of the disclosure, an OLED (organic light-emitting diode) having a self-luminous liquid crystal display layer may be used.

Field of view: An angle using a lens of an optical instrument as a vertex and formed between two edges of a maximum range of an object image of a measured target passable to the lens in the optical instrument, that is, as shown in FIG. 4, the field of view of the camera is an angle θ.

The embodiments of the present application provide a screen display control method and an electronic device. A first input of a user may be received; and in response to the first input, the camera is controlled to be in an operating state, and a target region of the screen is controlled to be in an off state, where the target region is a region determined according to a field of view of the camera and position information of the camera. By using the solution, in an aspect, in a case that the user triggers, through the first input, the camera installed under the screen to be in an operating state, the electronic device may control the target region determined according to the field of view of the camera and installation information of the camera to be in an off state, to prevent light generated by the lighting of the target region from interfering with the imaging of the camera, thereby improving the effect of an image captured by the camera. In another aspect, the electronic device determines the target region according to the field of view of the camera and the installation information of the camera, so that an area of the target region is relatively small, thereby increasing a screen-to-body ratio of the electronic device and improving the user experience.

The electronic device in the embodiments of the present application may be an electronic device with an operating system. The operating system may be an Android operating system, an iOS operating system, or another possible operating system, which is not specifically limited in the embodiments of the present application.

A software environment to which a display control method provided in the embodiments of the present application is applied is described below by using the Android operating system as an example.

Figure 1:
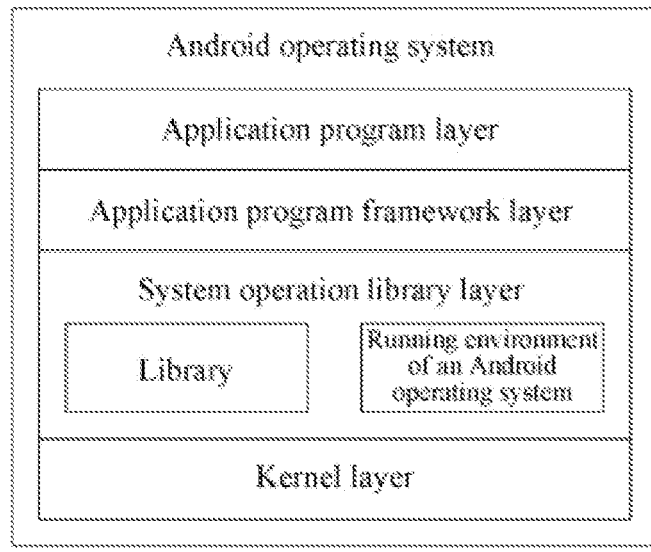
FIG. 1 is a schematic architectural diagram of an Android operating system according to an embodiment of the present application.

FIG. 1 is a schematic architectural diagram of an Android operating system according to an embodiment of the present application. In FIG. 1, an architecture of the Android operating system includes four layers: an application program layer, an application program framework layer, a system operation library layer, and a kernel layer (which may be specifically a Linux kernel layer).

The application program layer includes various application programs (including system application programs and third-party application programs) in the Android operating system.

The application program framework layer is a framework of an application program. A developer can develop some application programs based on the application program framework layer in a case of complying with the development principles of the framework of the application program.

The system operation library layer includes a library (also referred to as a system library) and a running environment of the Android operating system. The library mainly provides various resources required by the Android operating system. The running environment of the Android operating system is used for providing a software environment for the Android operating system.

The kernel layer is an operating system layer of the Android operating system and belongs to a bottom layer of a software layer of the Android operating system. The kernel layer provides, based on the Linux kernel, core system services and hardware-related driver programs for the Android operating system.

Using the Android operating system as an example, in the embodiments of the present application, the developer can develop, based on the system architecture of the Android operating system as shown in FIG. 1, a software program that implements the display control method provided in the embodiments of the present application, so that the displayed control method may run based on the Android operating system as shown in FIG. 1. That is, a processor or an electronic device can implement the display control method provided in the embodiments of the present application by running the software program in the Android operating system.

The electronic device in the embodiments of the present application may be a mobile electronic device or a non-mobile electronic device. For example, the mobile electronic device may be a mobile phone, a tablet computer, a notebook computer, a palmtop computer, an in-vehicle electronic device, a wearable device, an ultra-mobile personal computer (UMPC), a netbook, a personal digital assistant (PDA), or the like, and the non-mobile electronic device may be a personal computer (PC), a television (TV), a teller machine, a self-service machine, or the like, which is not specifically limited in the embodiments of the present application.

An execution entity of the display control method provided in the embodiments of the present application may be the foregoing electronic device, or may be a functional module and/or a functional entity in the electronic device capable of implementing the display control method. The specific execution entity may be determined according to actual usage requirements, which is not limited in the embodiments of the present application. The display control method provided in the embodiments of the present application is illustratively described by using the electronic device as an example.

In the embodiments of the present application, in a case that a user is chatting using a chat application program on an electronic device, in this case, a camera of the electronic device is in a non-operating state, a target region of the electronic device and other regions of the screen of the electronic device other than the target region (that is, the entire screen of the electronic device) are in an on state. If the user triggers the camera of the electronic device to be in an operating state through a touch and click input on the chat application program (for example, capturing images during the chat), the electronic device may control the target region determined according to a field of view of the camera and installation information of the camera to be in an off state, to prevent light generated by the lighting of the target region from interfering with the imaging of the camera, thereby improving the effect of the image captured by the camera.

Figure 2:
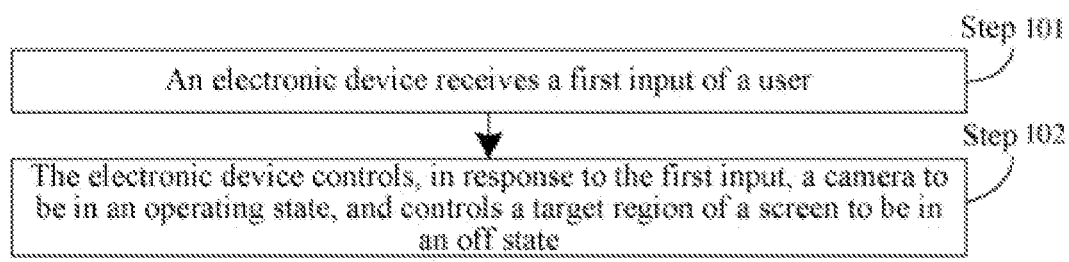
FIG. 2 is a first schematic diagram of a screen display control method according to an embodiment of the present application.

As shown in FIG. 2, an embodiment of the present application provides a display control method performed by an electronic device with a camera installed under a screen. The method may include the following step 101 and step 102.

Step 101. An electronic device receives a first input of a user.

Optionally, in this embodiment of the present application, the first input may be any one of the following: a touch input for the screen of the electronic device, a key input for the electronic device, a voice input for the electronic device, or the like. The touch input for the screen of the electronic device may be specifically a click input, a slide input, a double-click input, a long-press input, or the like, which may be specifically determined according to actual usage conditions, and is not specifically limited in the embodiments of the present application.

Step 102. The electronic device controls, in response to the first input, the camera to be in an operating state, and controls a target region of the screen to be in an off state.

The target region is a region determined according to a field of view of the camera and position information of the camera.

It should be noted that, in this embodiment of the present application, the camera being in the operating state refers to a state in which the user triggers or controls the camera to enter a shooting mode, that is, the camera enters a mode in which images can be captured and shot.

In addition, in this embodiment of the present application, the off state is a state when pixels of the target region of the screen of the electronic device are not lit. The on state is a state when the pixels of the target region of the screen of the electronic device are lit. According to actual usage conditions, there are the following three states: (1). In a case that the camera is in the operating state: the target region of the screen of the electronic device is in the off state, and other regions of the screen of the electronic device other than the target region are in the on state, for example, the user takes an image while using a chat application program. (2). In a first case that the camera is in a non-operating state: the target region of the electronic device and other regions of the screen of the electronic device other than the target region (that is, the entire screen of the electronic device) are in the on state, for example, a situation in which the electronic device runs a chat application program. (3). In a second case that the camera is in a non-operating state: the target region of the electronic device and other regions of the screen of the electronic device other than the target region (that is, the entire screen of the electronic device) are in the off state, for example, the electronic device is on standby and the screen of the electronic device is in the off state.

It should be noted that, in this embodiment of the present application, the screen of the electronic device includes the target region and the other regions of the screen other than the target region. In the following embodiments, a screen region is collectively referred to as the target region and the other regions of the screen other than the target region.

Optionally, in this embodiment of the present application, the position information of the camera may specifically include: a first distance, a second distance, and a third distance.

The first distance is a distance from the camera to a first frame of the electronic device, the second distance is a distance from the camera to a second frame of the electronic device, the third distance is a vertical distance between the camera and the screen, and the first frame is perpendicular to the second frame.

It should be noted that, in this embodiment of the present application, the position information of the camera may be an installation position of a fixed camera, or may be a position of a movable camera moving to a target position, where the target position may be a shooting position of the camera.

Figure 3:
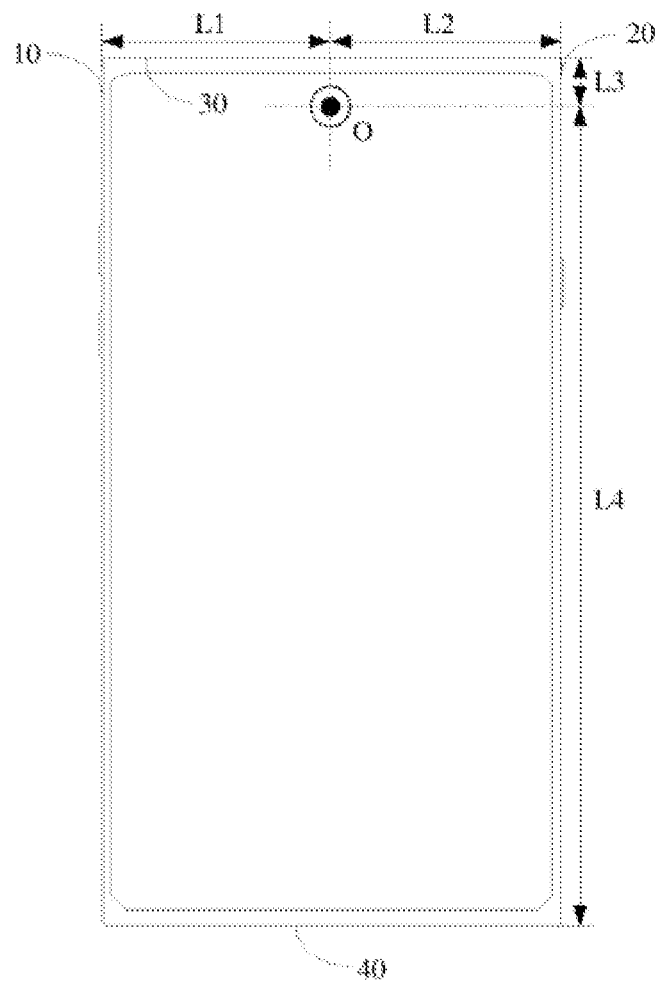
FIG. 3 is a first schematic structural diagram of an electronic device according to an embodiment of the present application.

For example, as shown in FIG. 3, the first frame may be a frame 10 or a frame 20. The second frame may be a frame 30 or a frame 40. The first distance may represent a distance L1 from a center point O of the projection of the camera on the screen to the frame 10 of the electronic device; or a distance L2 from a center point O of the projection of the camera on the screen to the frame 20 of the electronic device. The second distance may represent a distance L3 from the center point O of the projection of the camera on the screen to the frame 30 of the electronic device; or a distance L4 from the center point O of the projection of the camera on the screen to the frame 40 of the electronic device. The frame 10 is respectively perpendicular to the frame 30 and the frame 40, and the frame 20 is respectively perpendicular to the frame 30 and the frame 40.

Optionally, in this embodiment of the present application, the third distance may be used for representing a distance between the camera and the screen of the electronic device, and the third distance may be specifically a vertical distance between the camera and a liquid crystal display layer of the screen. For example, as shown in FIG. 4, a distance H between a vertex of the field of view of the camera and the liquid crystal display layer of the screen of the electronic device is the third distance.

It may be understood that, in this embodiment of the present application, the position information of the camera may include the first distance, the second distance, and the third distance, where the first distance and the second distance are distances from the camera to the two mutually perpendicular frames of the electronic device, and the third distance may be used for representing the vertical distance between the camera and the screen. Therefore, the electronic device can accurately locate a position of the camera on the electronic device through the position information of the camera, thereby accurately locating a position relationship between the camera and the screen of the electronic device, and providing a positioning reference for the subsequent determination of the target region.

It should be noted that, in this embodiment of the present application, the field of view is a field of view of the camera, that is, an angle using a lens of the camera as a vertex and formed between two edges of a maximum range of an object image of a measured target passable to the lens. As shown in FIG. 4, an angle θ is the field of view of the camera.

The embodiments of the present application provide a screen display control method. A first input of a user may be received; and in response to the first input, the camera is controlled to be in an operating state, and a target region of the screen is controlled to be in an off state, where the target region is a region determined according to a field of view of the camera and position information of the camera. By using the solution, in an aspect, in a case that the user triggers, through the first input, the camera installed under the screen to be in an operating state, the electronic device may control the target region determined according to the field of view of the camera and installation information of the camera to be in an off state, to prevent light generated by the lighting of the target region from interfering with the imaging of the camera, thereby improving the effect of an image captured by the camera. In another aspect, the electronic device determines the target region according to the field of view of the camera and the installation information of the camera, so that an area of the target region is relatively small, thereby increasing a screen-to-body ratio of the electronic device and improving the user experience.

Figure 5:
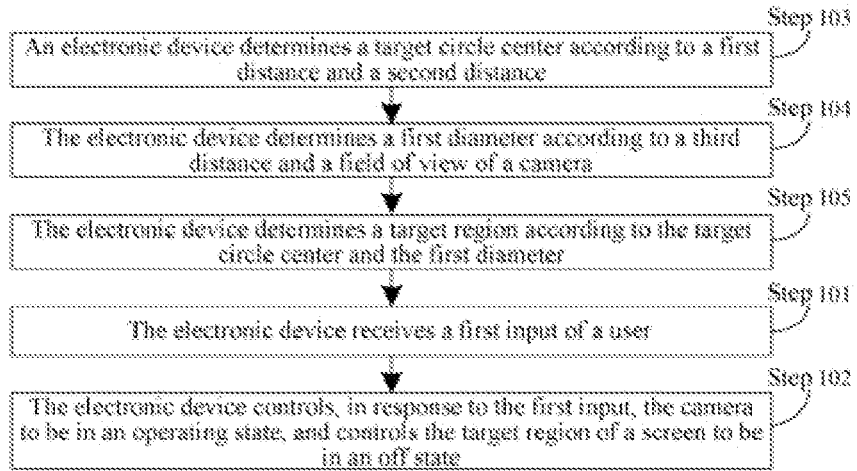
FIG. 5 is a second schematic diagram of a screen display control method according to an embodiment of the present application.

Optionally, with reference to FIG. 2, as shown in FIG. 5, before step 102, the screen display control method provided in the embodiments of the present application may further include the following step 103 to step 105.

Step 103. The electronic device determines a target circle center according to the first distance and the second distance.

The first distance and the second distance are distances from the camera to two mutually perpendicular frames of the electronic device.

It should be noted that, in this embodiment of the present application, step 103 to step 105 may be performed before step 101, or may be performed after step 101 and before step 102. In this embodiment of the present application, an example in which step 103 to step 105 are performed before step 101 is used for illustrative description.

Optionally, in this embodiment of the present application, the determining a target circle center according to the first distance and the second distance may be specifically: determining a center point of the projection of the camera on the screen of the electronic device according to the first distance and the second distance; and determining the center point of the projection of the camera on the screen of the electronic device as the target circle center.

Step 104. The electronic device determines a first diameter according to the third distance and the field of view of the camera.

The third distance may be used for representing the vertical distance between the camera and the screen.

Optionally, in this embodiment of the present application, a first radius is determined according to a distance (that is, the third distance) between the vertex of the field of view of the camera and the screen of the electronic device, and a trigonometric function relationship between the field of view and the first diameter, that is, a tangent value of half the angle of the field of view is equal to a ratio of the first radius (that is, half of the first diameter) and the third distance, to further determine the first diameter.

Specifically, if the field of view is θ, and the third distance is H, a calculation formula of the first diameter D1 is $D1 = 2H \cdot \tan(\theta/2)$.

Step 105. The electronic device determines a target region according to the target circle center and the first diameter.

Figure 6:
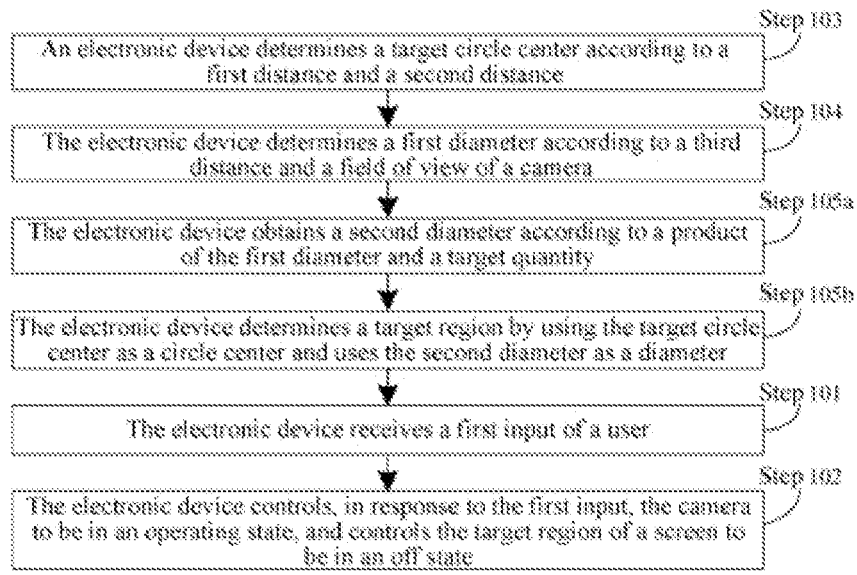
FIG. 6 is a third schematic diagram of a screen display control method according to an embodiment of the present application.

Optionally, with reference to FIG. 5, as shown in FIG. 6, step 105 may be specifically implemented through the following step 105a and step 105b.

Step 105a. The electronic device obtains a second diameter according to a product of the first diameter and a target quantity.

The target quantity is a quantity of pixels per unit length of the screen of the electronic device.

It should be noted that, screen resolution is a resolution displayed by a screen (for example, the screen of the electronic device), and is generally represented by the quantity of pixels included in a vertical direction and a horizontal direction on the screen. Common screen resolutions are 640×480, 720×640, 1280×720, 1900×1080, 2560×1440, and so on. For example, the screen resolution of 640×480 means that the quantity of pixels included in the vertical direction of the screen is 640, and the quantity of pixels included in the horizontal direction of the screen is 480. Specifically, a screen with different resolutions can be selected according to actual usage conditions.

Optionally, in this embodiment of the present application, the target quantity may be the quantity of pixels per unit length of the screen of the electronic device. Specifically, the target quantity may be a ratio of the quantity of pixels in the horizontal direction of the screen of the electronic device to a size in the horizontal direction of the screen of the electronic device; or the target quantity may be a ratio of the quantity of pixels in the vertical direction of the screen of the electronic device to a size in the vertical direction of the screen of the electronic device.

It should be noted that, in this embodiment of the present application, the target quantity calculated according to the horizontal direction of the screen of the electronic device and the target quantity calculated according to the vertical direction of the screen of the electronic device may be the same or different. In a case that the target quantity calculated according to the horizontal direction of the screen of the electronic device is different from the target quantity calculated according to the vertical direction of the screen of the electronic device, the target quantity calculated according to the horizontal direction is used.

In addition, in this embodiment of the present application, a single pixel can only be in one of two states of being lit or not lit, that is, a single pixel is a smallest unit of an image. Therefore, for the second diameter obtained by multiplying the first diameter and the target quantity, an integer value of the second diameter can be generally obtained by rounding down or rounding up (that is, the second diameter is an integer multiple of a pixel size). In this embodiment of the present application, an example in which the second diameter is rounded down is used for illustrative description, which does not constitute a limitation on the rounding operation on the second diameter.

Optionally, in this embodiment of the present application, the second diameter is a pixel correction value of the first diameter, that is, a sum of lengths of unlit pixels on the first diameter is used as the second diameter, and the first diameter is greater than or equal to the second diameter.

For example, as shown in FIG. 4, assuming that the field of view of the camera disposed under the screen of the electronic device is 78° (that is, θ is 78°), and a distance H between a vertex M of the field of view of the camera and the liquid crystal display layer of the screen of the electronic device is 3.1 mm (that is, the third distance is 3.1 mm), the first diameter $D1=2H\cdot\tan(\theta/2)=2\times3.1\times\tan(78/2)=5.02$ mm. If a resolution of the screen of the electronic device is 1900×1080 (that is, the screen of the electronic device has 1900 pixels in the vertical direction and the screen of the electronic device has 1080 pixels in the horizontal direction), and a length of the screen of the electronic device in the horizontal direction is 70 mm, a target quantity X may be calculated by the following formula: $X=1080/70=15.43$ px, where 15.43 px (px is the abbreviation of pixel, which refers to the smallest pixel in an image) represents that in the horizontal direction of the screen of the electronic device, there are 15.43 pixels distributed per 1 mm of length. The second diameter is calculated according to the first diameter and the target quantity, $D2=D1\cdot X=5.02\times15.43=77$ px, that is, the second diameter is a diameter of a length of 77 pixels in a target direction.

Step 105b. The electronic device determines the target region by using the target circle center as a circle center and uses the second diameter as a diameter.

Optionally, in this embodiment of the present application, determining the target region may be specifically that: the electronic device determines a circular region by using the target circle center as a circle center and uses the second diameter as a diameter, and determines a region formed by all pixels in the circular region as the target region.

For example, as shown in FIG. 4, after the electronic device obtains the second diameter D2 according to a product of the first diameter D1 and the target quantity X, and the electronic device determines the center point O of the projection of the camera on the screen of the electronic device as the target circle center, the electronic device determines a circular region by using O as a circle center and using D2 as a diameter, and determines a region formed by all pixels in the circular region as the target region.

In this embodiment of the present application, the electronic device may determine the target circle center according to the first distance and the second distance, and determine the second diameter according to the third distance, the field of view of the camera, and the target quantity. Therefore, the electronic device determines the target region by using the target circle center as a circle center and the second diameter as a diameter, so that an area of the target region may be relatively small, thereby increasing the screen-to-body ratio of the electronic device and improving the user experience.

Figure 7:
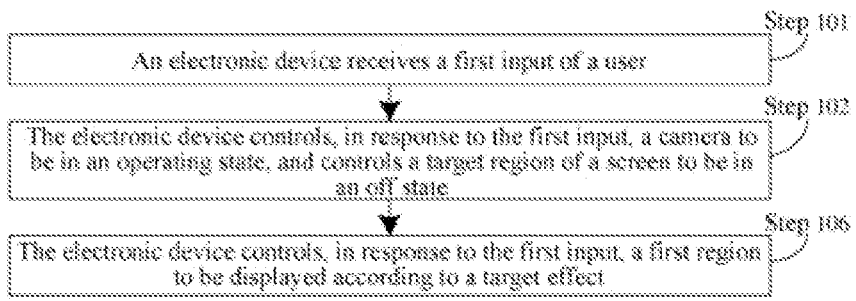
FIG. 7 is a fourth schematic diagram of a screen display control method according to an embodiment of the present application.

Optionally, with reference to FIG. 2, as shown in FIG. 7, after step 101, the screen display control method provided in the embodiments of the present application may further include the following step 106.

Step 106. The electronic device controls, in response to the first input, a first region to be displayed according to a target effect.

The first region is a region located around the target region of the screen of the electronic device.

It should be noted that, in this embodiment of the present application, an execution sequence of step 102 and step 106 is not specifically limited, and may be determined according to actual usage conditions. For example, step 106 may be performed after step 102, or may be performed simultaneously with step 102. In this embodiment of the present application, an example in which step 102 is performed before step 106 is used for illustrative description.

Optionally, in this embodiment of the present application, a shape of the first region may be any one of the following: a triangle, a rectangle, a hexagon, a circle, or the like. A size of the first region may be a preset size. The shape of the first region and the size of the first region may be specifically determined according to actual usage conditions, which are not specifically limited in the embodiments of the present application.

Optionally, in this embodiment of the present application, the target effect may be specifically at least one of the following: the first region is displayed according to a preset color, the first region is displayed according to a preset light effect, the first region is displayed with a preset identifier, or the like. The preset color may be another color other than black. The preset light effect may be specifically at least one of the following: flashing according to a preset time, switching a display color according to a preset time, switching display brightness according to a preset time, or the like. The preset identifier may be at least one of the following: a circle shown in solid lines, a triangle shown in solid lines, a circle shown in dashed lines, or the like. The target effect may be specifically determined according to actual usage conditions, which is not specifically limited in the embodiments of the present application.

Figure 8:
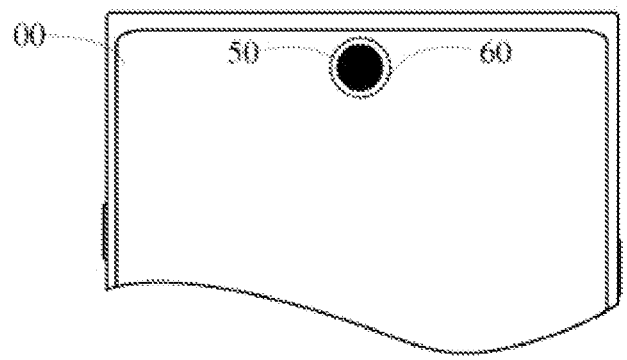
FIG. 8 is a second schematic structural diagram of an electronic device according to an embodiment of the present application.

For example, as shown in FIG. 8, assuming that the user intends to capture an image by using an electronic device 00, the user may touch an icon of a camera application program (that is, the first input) to trigger a target region 50 of the screen of the electronic device 00 to be in an off state, and trigger a first region 60 located around the target region 50 to display a preset identifier of a dotted ring.

In this embodiment of the present application, the electronic device may further display a region around the target region according to the target effect in response to the first input of the user. Therefore, the user may determine, according to whether the region around the target region is displayed with the target effect, whether the camera of the electronic device is in an operating state, which is convenient for the user to use.

Optionally, in this embodiment of the present application, the screen display control method provided in the embodiments of the present application may further include the following step 107.

Step 107. The electronic device controls the screen region to be in a target state in a case that the camera is in a non-operating state.

The target state is an on state or an off state.

It should be noted that, in this embodiment of the present application, step 101 and step 102 are a control method in which the camera in the operating state, step 107 is a control method in which the camera in the non-operating state. An execution order of step 101, step 102, and step 107 is not specifically limited in the embodiments of the present application. For example, step 107 may be performed before step 101, and step 107 may also be performed after step 102, which may be specifically determined according to actual usage requirements.

In addition, in this embodiment of the present application, the screen region includes the target region and the other regions of the screen other than the target region.

Optionally, in this embodiment of the present application, the non-operating state is a state in which the camera of the electronic device is in a closed state, that is, a state in which the camera cannot capture images or shoot images.

Specifically, In the embodiments of the present application, in a case that a user is chatting using a chat application program on an electronic device, in this case, a camera of the electronic device is in a non-operating state, a target region of the electronic device and other regions of the screen of the electronic device other than the target region (that is, the entire screen of the electronic device) are in an on state. If the user controls the electronic device to be in a standby state, in this case, the camera of the electronic device is in a non-operating state, the target region of the electronic device and other regions of the screen of the electronic device other than the target region (that is, the entire screen of the electronic device) are in an off state.

In this embodiment of the present application, the entire screen of the electronic device is in the on state or the off state in a case that the camera is in the non-operating state. Therefore, the target region is not displayed on the screen of the electronic device in a case that the user does not use the camera of the electronic device, so that the appearance of the screen of the electronic device is not affected.

It should be noted that, in this embodiment of the present application, the display control methods shown in the figures are all illustratively described by using a figure in the embodiments of the present application as an example. During specific implementation, the display control methods shown in the figures may further be implemented with reference to any other figures shown in the foregoing embodiments, and details are not described herein again.

Figure 9:
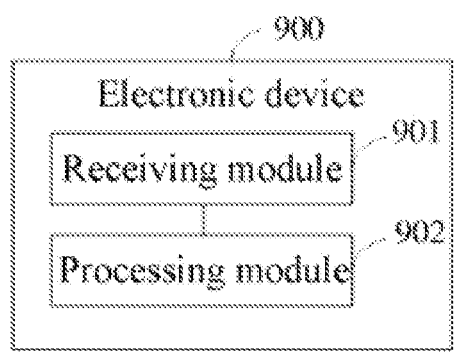
FIG. 9 is a first schematic structural diagram of an electronic device according to an embodiment of the present application.

As shown in FIG. 9, an embodiment of the present application provides an electronic device 900. A camera is installed under a screen of the electronic device 900. The electronic device 900 may include: a receiving module 901 and a processing module 902. The receiving module 901 may be configured to receive a first input of a user; and the processing module 902 may be configured to control, in response to the first input received by the receiving module 901, the camera to be in an operating state, and control a target region of the screen to be in an off state, where the target region is a region determined according to a field of view of the camera and position information of the camera.

Optionally, in this embodiment of the present application, the position information of the camera may include: a first distance, a second distance, and a third distance. The first distance is a distance from the camera to a first frame of the electronic device 900, the second distance is a distance from the camera to a second frame of the electronic device 900, the third distance is a vertical distance between the camera and the screen of the electronic device 900, and the first frame is perpendicular to the second frame.

Figure 10:
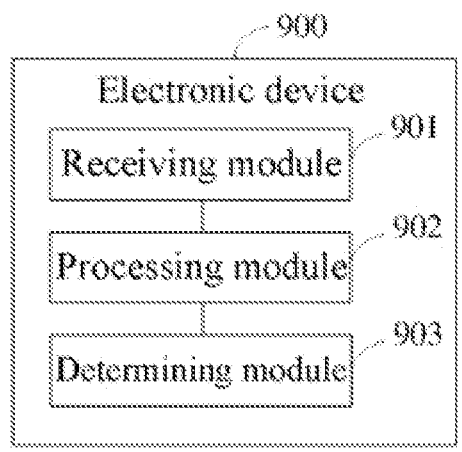
FIG. 10 is a second schematic structural diagram of an electronic device according to an embodiment of the present application.

Optionally, with reference to FIG. 9, as shown in FIG. 10, the electronic device 900 provided in this embodiment of the present application may further include a determining module 903. The determining module 903 may be configured to determine a target circle center according to the first distance and the second distance; determine a first diameter according to the third distance and the field of view of the camera; and determine the target region according to the target circle center and the first diameter.

Optionally, in this embodiment of the present application, the determining module 903 may be further configured to obtain a second diameter according to a product of the first diameter and a target quantity; and determine the target region by using the target circle center as a circle center and using the second diameter as a diameter, where the target quantity is a quantity of pixels per unit length of the screen of the electronic device 900.

Optionally, in this embodiment of the present application, the processing module 902 may be further configured to control, in response to the first input received by the receiving module 901, a first region to be displayed according to a target effect, where the first region is a region located around the target region of the screen of the electronic device 900.

Optionally, in this embodiment of the present application, the processing module 902 may be further configured to control the target region and other regions of the screen other than the target region to be in a target state in a case that the camera is in a non-operating state, where the target state is an on state or an off state.

The electronic device provided in this embodiment of the present application can implement processes implemented by the electronic device in the foregoing method embodiments, and to avoid repetition, details are not described herein again.

According to the electronic device provided in this embodiment of the present application, in an aspect, in a case that the user triggers, through the first input, the camera installed under the screen to be in an operating state, the electronic device may control the target region determined according to the field of view of the camera and installation information of the camera to be in an off state, to prevent light generated by the lighting of the target region from interfering with the imaging of the camera, thereby improving the effect of an image captured by the camera. In another aspect, the electronic device determines the target region according to the field of view of the camera and the installation information of the camera, so that an area of the target region is relatively small, thereby increasing a screen-to-body ratio of the electronic device and improving the user experience.

Figure 11:
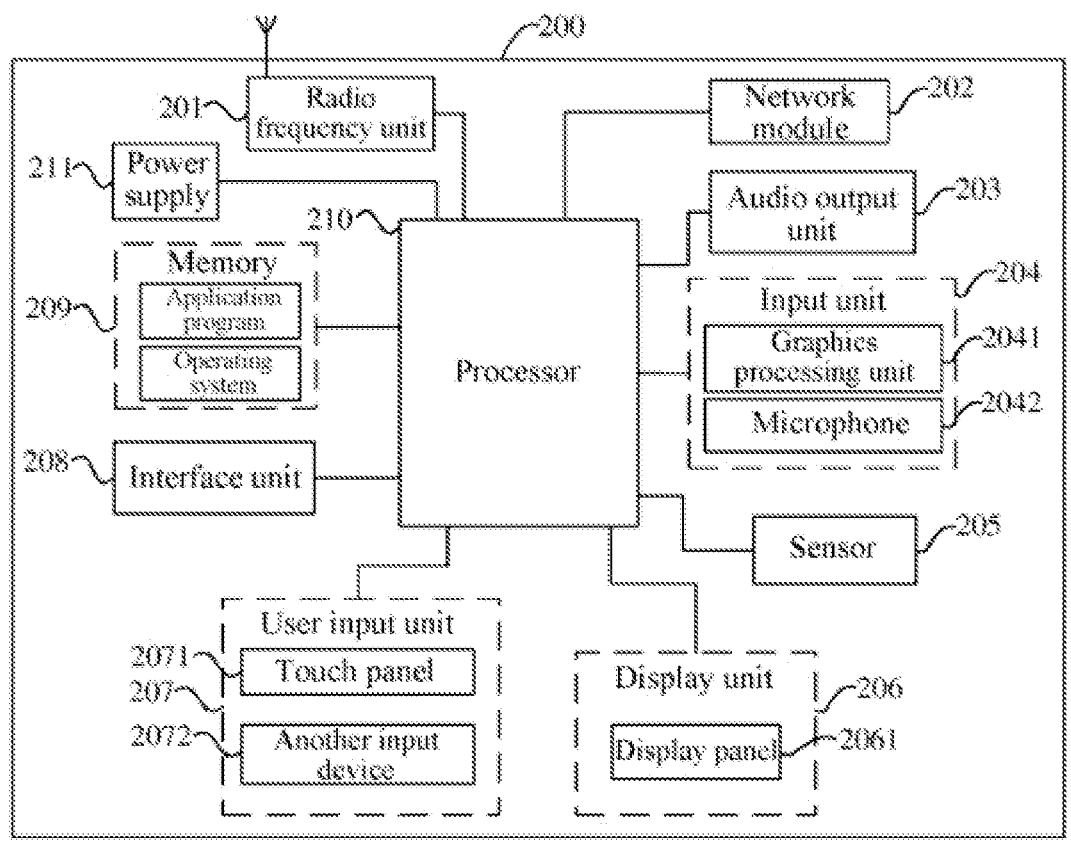
FIG. 11 is a schematic diagram of hardware of an electronic device according to an embodiment of the present application.

FIG. 11 is a schematic diagram of a hardware structure of an electronic device implementing various embodiments of the present application. As shown in FIG. 11, the electronic device 200 includes, but is not limited to, components such as a radio frequency unit 201, a network module 202, an audio output unit 203, an input unit 204, a sensor 205, a display unit 206, a user input unit 207, an interface unit 208, a memory 209, a processor 210, and power supply 211. A person skilled in the art may understand that the electronic device structure shown in FIG. 11 does not constitute a limitation to the electronic device. The electronic device may include more or fewer components than those shown in the figure, may combine some component, or may have different component arrangements. In the embodiments of the present application, the electronic device includes, but is not limited to, a mobile phone, a tablet computer, a notebook computer, a palmtop computer, an in-vehicle electronic device, a wearable device, a pedometer, and the like.

The user input unit 207 or the input unit 204 may be configured to receive a first input of a user. The processing module 210 may be configured to control, in response to the first input received by the user input unit 207 or the input unit 204, the camera to be in an operating state, and control a target region of the screen to be in an off state, where the target region is a region determined according to a field of view of the camera and position information of the camera.

According to the electronic device provided in this embodiment of the present application, in an aspect, in a case that the user triggers, through the first input, the camera installed under the screen to be in an operating state, the electronic device may control the target region determined according to the field of view of the camera and installation information of the camera to be in an off state, to prevent light generated by the lighting of the target region from interfering with the imaging of the camera, thereby improving the effect of an image captured by the camera. In another aspect, the electronic device determines the target region according to the field of view of the camera and the installation information of the camera, so that an area of the target region is relatively small, thereby increasing a screen-to-body ratio of the electronic device and improving the user experience.

It should be understood that in the embodiments of the present application, the radio frequency unit 201 may be configured to receive and send information or receive and send a signal during a call. Specifically, after receiving downlink data from a base station, the radio frequency unit 201 sends the data to the processor 210 for processing; and sends uplink data to the base station. Generally, the radio frequency circuit 201 includes, but is not limited to, an antenna, at least one amplifier, a transceiver, a coupler, a low noise amplifier, a duplexer, and the like. In addition, the radio frequency circuit 201 may further communicate with another device through a wireless communication system and a network.

The electronic device provides a user with wireless broadband Internet access through the network module 202, such as helping the user to receive and send an email, browse a webpage, and access stream media.

The audio output unit 203 may convert audio data received by the radio frequency unit 201 or the network module 202 or stored in the memory 209 into audio signals and output the audio signals as sound. In addition, the audio output unit 203 may also provide audio output (for example, call signal reception sound and message reception sound) related to a specific function performed by the electronic device 200. The audio output unit 203 includes a speaker, a buzzer, a receiver, and the like.

The input unit 204 is configured to receive audio or video signals. The input unit 204 may include a graphics processing unit (GPU) 2041 and a microphone 2042. The graphics processing unit 2041 processes image data of static pictures or videos obtained by an image capture apparatus (such as a camera) in a video capture mode or an image capture mode. The processed image frame may be displayed on the display unit 206. The image frame processed by the graphics processing unit 2041 may be stored in the memory 209 (or another storage medium) or sent by the radio frequency unit 201 or the network module 202. The microphone 2042 may receive sound, and can process such sound into audio data. The processed audio data may be converted, in a case of a telephone call mode, into an output format that can be sent to a mobile communication base station by the radio frequency unit 201.

The electronic device 200 further includes at least one sensor 205, such as an optical sensor, a motion sensor, and other sensors. Specifically, the optical sensor includes an ambient light sensor and a proximity sensor. The ambient light sensor may adjust luminance of a display panel 2061 according to brightness of the ambient light. The proximity sensor may switch off the display panel 2061 and/or backlight when the electronic device 200 is moved to the ear. As one type of the motion sensor, an acceleration sensor may detect a magnitude of acceleration in various directions (generally three axes), and may detect a magnitude and a direction of gravity when static, which may be configured to recognize application of electronic device gestures (such as horizontal and vertical screen switching, related games, and magnetometer posture calibration), vibration recognition related functions (such as pedometer and tap), and the like. The sensor 205 may further include a fingerprint sensor, a pressure sensor, an iris sensor, a molecular sensor, a gyroscope, a barometer, a hygrometer, a thermometer, an infrared sensor, and the like, and details are not described herein again.

The display unit 206 is configured to display information inputted by the user or information provided for the user. The display unit 206 may include the display panel 2061. The display panel 2061 may be configured in the form of a liquid crystal display (LCD), an organic light-emitting diode (OLED), or the like.

The user input unit 207 may be configured to receive inputted digit or character information, and generate a keyboard signal input related to the user setting and function control of the electronic device. Specifically, the user input unit 207 includes a touch panel 2071 and another input device 2072. The touch panel 2071, also referred to as a touchscreen, may collect a touch operation of a user on or near the touch panel (such as an operation of a user on or near the touch panel 2071 by using any suitable object or attachment, such as a finger or a touch pen). The touch panel 2071 may include two parts: a touch detection apparatus and a touch controller. The touch detection apparatus detects a touch orientation of the user, detects a signal brought by the touch operation, and sends the signal to the touch controller. The touch controller receives touch information from the touch detection apparatus, converts the touch information into a contact coordinate, then sends the contact coordinate to the processor 210, and receives and executes a command sent by the processor 210. In addition, the touch panel 2071 may be implemented by using various types, such as a resistive type, a capacitive type, an infrared type, and a surface acoustic wave type. In addition to the touch panel 2071, the user input unit 207 may further include the another input device 2072. Specifically, the another input device 2072 may include, but is not limited to, a physical keyboard, a functional key (such as a volume control key or a switch key), a track ball, a mouse, and a joystick. Details are not described herein again.

Further, the touch panel 2071 may cover the display panel 2061. After detecting a touch operation on or near the touch panel 2071, the touch panel transfers the touch operation to the processor 210, to determine a type of the touch event. Then, the processor 210 provides corresponding visual output on the display panel 2061 according to the type of the touch event. Although in FIG. 11, the touch panel 2071 and the display panel 2061 are used as two separate parts to implement input and output functions of the electronic device, in some embodiments, the touch panel 2071 and the display panel 2061 may be integrated to implement the input and output functions of the electronic device, which is not limited herein.

The interface unit 208 is an interface for connecting an external apparatus to the electronic device 200. For example, the external apparatus may include a wired or wireless headset port, an external power supply (or battery charger) port, a wired or wireless data port, a memory card port, a port for connecting an apparatus with identification modules, an audio input/output (I/O) port, a video I/O port, a headphone port, and the like. The interface unit 208 may be configured to receive input (such as data information and power) from an external apparatus and send the received input to one or more elements in the electronic device 200 or may be configured to transfer data between the electronic device 200 and an external apparatus.

The memory 209 may be configured to store a software program and various data. The memory 209 may mainly include a program storage area and a data storage area. The program storage area may store an operating system, an application program required by at least one function (for example, a sound playback function and an image playback function), or the like. The data storage area may store data (for example, audio data and a phone book) created according to use of the mobile phone. In addition, the memory 209 may include a high speed random access memory, and may further include a non-volatile memory, such as at least one magnetic disk storage device, a flash memory device or another non-volatile solid state storage device.

The processor 210 is a control center of the electronic device, and connects various parts of the entire electronic device by using various interfaces and lines. By running or executing a software program and/or a module stored in the memory 209, and invoking data stored in the memory 209, the processor 209 performs various functions of the electronic device and processes data, thereby performing overall monitoring on the electronic device. The processor 210 may include one or more processing units. Optionally, the processor 210 may integrate an application processor and a modem processor. The application processor mainly processes an operating system, a user interface, an application program, and the like. The modem processor mainly processes wireless communication. It may be understood that the foregoing modem processor may alternatively not be integrated into the processor 210.

The electronic device 200 may further include the power supply 211 (such as a battery) for supplying power to the components. Optionally, the power supply 211 may be logically connected to the processor 210 by using a power management system, thereby implementing functions such as charging, discharging, and power consumption management by using the power management system.

In addition, the electronic device 200 includes some functional modules not shown, and details are not described herein again.

Optionally, the embodiments of the present application further provide an electronic device, including the processor 210, the memory 209, and the computer program stored in the memory 209 and capable of running on the processor 210 that are shown in FIG. 11. The computer program, when executed by the processor 210, implementing the processes of the foregoing method embodiments and capable of achieving the same technical effects. To avoid repetition, details are not described herein again.

The embodiments of the present application further provide a computer-readable storage medium, storing a computer program, the computer program, when executed by a processor, implementing the processes of the foregoing method embodiments and capable of achieving the same technical effects. To avoid repetition, details are not described herein again. The computer-readable storage medium is a flash drive, a read-only memory (ROM), a random access memory (RAM), a magnetic disk, an optical disc, or the like.

It should be noted that, the terms "include", "comprise", or any other variation thereof in this specification is intended to cover a non-exclusive inclusion, so that a process, a method, an article, or an apparatus that includes a series of elements and that not only includes such elements, but also includes other elements not explicitly listed, or may further include elements inherent in the process, the method, the article, or the apparatus. Without more limitations, elements defined by the sentence "including one" does not exclude that there are still other same elements in the processes, methods, objects, or apparatuses.

Through the descriptions of the foregoing implementations, a person skilled in the art may clearly understand that the method according to the foregoing embodiments may be implemented by means of software and a necessary general hardware platform, and certainly, may also be implemented by hardware, but in many cases, the former manner is a better implementation. Based on such an understanding, the technical solutions in the present application essentially or the part contributing to the related art may be implemented in the form of a software product. The computer software product is stored in a storage medium (for example, a ROM/RAM, a magnetic disk, or an optical disc), and includes several instructions for instructing an electronic device (which may be a smartphone, a computer, a server, an air conditioner, a network device, or the like) to perform the method described in the embodiments of the present application.

The embodiments of the present application are described above with reference to the figures. However, the present application is not limited to the specific implementations. The specific implementations are merely exemplary and not limitative. Under the teaching of the present application, many forms made by a person of ordinary skill in the art without departing from spirit of the present application and the protection scope of the claims shall all fall within the protection scope of the present application.

What is claimed is:

1. A screen display control method, performed by an electronic device with a camera installed under a screen, the method comprising:
   receiving a first input of a user; and
   controlling, in response to the first input, the camera to be in an operating state, and controlling a target region of the screen to be in an off state, wherein the target region is a region determined according to a field of view of the camera and position information of the camera;
   wherein the position information of the camera comprises: a first distance, a second distance, and a third distance, wherein
   the first distance is a distance from the camera to a first frame of the electronic device, the second distance is a distance from the camera to a second frame of the electronic device, the third distance is a vertical distance between the camera and the screen, and the first frame is perpendicular to the second frame.

2. The method according to claim 1, wherein before the controlling a target region of the screen to be in an off state, the method further comprises:
   determining a target circle center according to the first distance and the second distance;
   determining a first diameter according to the third distance and the field of view of the camera; and
   determining the target region according to the target circle center and the first diameter.

3. The method according to claim 2, wherein the determining the target region according to the target circle center and the first diameter comprises:
   obtaining a second diameter according to a product of the first diameter and a target quantity; and
   determining the target region by using the target circle center as a circle center and using the second diameter as a diameter, wherein
   the target quantity is a quantity of pixels per unit length of the screen.

4. The method according to claim 1, further comprising:
   controlling, in response to the first input, a first region to be displayed according to a target effect, wherein
   the first region is a region located around the target region of the screen.

5. The method according to claim 1, further comprising:
controlling a screen region to be in a target state in a case that the camera is in a non-operating state, wherein the target state is an on state or an off state.

6. An electronic device, installed with a camera under a screen of the electronic device, the electronic device comprising a processor, a memory, and a computer program stored in the memory and capable of being run on the processor, the computer program, when executed by the processor, implementing steps of:
receiving a first input of a user; and
controlling, in response to the first input, the camera to be in an operating state, and controlling a target region of the screen to be in an off state, wherein the target region is a region determined according to a field of view of the camera and position information of the camera;
wherein the position information of the camera comprises: a first distance, a second distance, and a third distance, wherein
the first distance is a distance from the camera to a first frame of the electronic device, the second distance is a distance from the camera to a second frame of the electronic device, the third distance is a vertical distance between the camera and the screen, and the first frame is perpendicular to the second frame.

7. The electronic device according to claim 6, wherein before the step of controlling a target region of the screen to be in an off state, the computer program further implements steps of:
determining a target circle center according to the first distance and the second distance;
determining a first diameter according to the third distance and the field of view of the camera; and
determining the target region according to the target circle center and the first diameter.

8. The electronic device according to claim 7, wherein the step of determining the target region according to the target circle center and the first diameter comprises:
obtaining a second diameter according to a product of the first diameter and a target quantity; and
determining the target region by using the target circle center as a circle center and using the second diameter as a diameter, wherein
the target quantity is a quantity of pixels per unit length of the screen.

9. The electronic device according to claim 6, wherein the computer program further implements steps of:
controlling, in response to the first input, a first region to be displayed according to a target effect, wherein
the first region is a region located around the target region of the screen.

10. The electronic device according to claim 6, wherein the computer program further implements steps of:
controlling a screen region to be in a target state in a case that the camera is in a non-operating state, wherein the target state is an on state or an off state.

11. A non-transitory computer-readable storage medium, storing a computer program, the computer program, when executed by a processor, implementing the screen display control method according to claim 1.

12. The storage medium according to claim 11, wherein the computer program further implements steps of:
controlling, in response to the first input, a first region to be displayed according to a target effect, wherein
the first region is a region located around the target region of the screen.

13. The storage medium according to claim 11, wherein the computer program further implements steps of:
controlling a screen region to be in a target state in a case that the camera is in a non-operating state, wherein the target state is an on state or an off state.

14. The storage medium according to claim 11, wherein before the step of controlling a target region of the screen to be in an off state, the computer program further implements steps of:
determining a target circle center according to the first distance and the second distance;
determining a first diameter according to the third distance and the field of view of the camera; and
determining the target region according to the target circle center and the first diameter.

15. The storage medium according to claim 14, wherein the step of determining the target region according to the target circle center and the first diameter comprises:
obtaining a second diameter according to a product of the first diameter and a target quantity; and
determining the target region by using the target circle center as a circle center and using the second diameter as a diameter, wherein
the target quantity is a quantity of pixels per unit length of the screen.

* * * * *